United States Patent
Konno et al.

(10) Patent No.: US 8,829,489 B2
(45) Date of Patent: Sep. 9, 2014

(54) NITRIDE SEMICONDUCTOR TEMPLATE AND LIGHT-EMITTING DIODE

(71) Applicant: Hitachi Cable, Ltd., Tokyo (JP)

(72) Inventors: Taichiroo Konno, Hitachi (JP); Hajime Fujikura, Mito (JP)

(73) Assignee: Hitachi Metals, Ltd., Tokyo (JP)

( * ) Notice: Subject to any disclaimer, the term of this patent is extended or adjusted under 35 U.S.C. 154(b) by 48 days.

(21) Appl. No.: 13/714,300

(22) Filed: Dec. 13, 2012

(65) Prior Publication Data

US 2013/0153858 A1    Jun. 20, 2013

(30) Foreign Application Priority Data

Dec. 15, 2011   (JP) .................................. 2011-274222
Nov. 14, 2012   (JP) .................................. 2012-250072

(51) Int. Cl.
| | | |
|---|---|---|
| H01L 33/06 | (2010.01) | |
| H01L 29/36 | (2006.01) | |
| H01L 33/02 | (2010.01) | |
| H01L 33/32 | (2010.01) | |

(52) U.S. Cl.
CPC .............. *H01L 29/36* (2013.01); *H01L 33/025* (2013.01); *H01L 33/06* (2013.01); *H01L 33/325* (2013.01)
USPC .......................................... 257/13; 257/609

(58) Field of Classification Search
CPC ........ H01L 29/36; H01L 33/025; H01L 33/06
USPC ........................................................ 257/13
See application file for complete search history.

(56) References Cited

U.S. PATENT DOCUMENTS

| | | | | |
|---|---|---|---|---|
| 6,153,010 | A  * | 11/2000 | Kiyoku et al. ................... | 117/95 |
| 6,812,051 | B2 * | 11/2004 | Usui et al. ........................ | 438/22 |
| 7,053,420 | B2 * | 5/2006 | Tadatomo et al. ............... | 257/98 |
| 8,664,663 | B2 * | 3/2014 | Konno et al. .................... | 257/76 |
| 2002/0195619 | A1 * | 12/2002 | Makimoto et al. ............. | 257/197 |
| 2003/0141506 | A1 * | 7/2003 | Sano et al. ....................... | 257/78 |
| 2004/0072383 | A1 * | 4/2004 | Nagahama et al. ............. | 438/47 |
| 2004/0104390 | A1 * | 6/2004 | Sano et al. ....................... | 257/78 |
| 2005/0133798 | A1 * | 6/2005 | Jung et al. ....................... | 257/79 |
| 2007/0241353 | A1 * | 10/2007 | Taki ................................. | 257/94 |
| 2009/0008648 | A1 * | 1/2009 | Biwa et al. ...................... | 257/76 |
| 2009/0315065 | A1 * | 12/2009 | Komada .......................... | 257/99 |
| 2013/0270575 | A1 * | 10/2013 | Humphreys et al. ............ | 257/76 |

FOREIGN PATENT DOCUMENTS

| | | |
|---|---|---|
| JP | 2002-280611 A | 9/2002 |
| JP | 2005-183997 A | 7/2005 |
| JP | 3886341 B2 | 2/2007 |

\* cited by examiner

*Primary Examiner* — Long K Tran
*Assistant Examiner* — Jordan Klein
(74) *Attorney, Agent, or Firm* — McGinn IP Law Group, PLLC

(57) ABSTRACT

A nitride semiconductor template includes a substrate, and a group III nitride semiconductor layer formed on the substrate and including a Si-doped layer doped with Si as an uppermost layer thereof. The group III nitride semiconductor layer has a total thickness of not less than 4 μm and not more than 10 μm. The Si-doped layer includes a Si concentration gradient layer having a carrier concentration that gradually decreases toward an outermost surface thereof so as to be not less than $1\times10^{17}$ cm$^{-3}$ and not more than $5\times10^{17}$ cm$^{-3}$ at the outermost surface of the group III nitride semiconductor layer.

9 Claims, 13 Drawing Sheets

NITRIDE SEMICONDUCTOR TEMPLATE AND LIGHT-EMITTING DIODE

The present application is based on Japanese patent application Nos. 2011-274222 and 2012-250072 filed on Dec. 15, 2011 and Nov. 14, 2012, respectively, the entire contents of which are incorporated herein by reference.

BACKGROUND OF THE INVENTION

1. Field of the Invention

The invention relates to a nitride semiconductor template and a light-emitting diode using the nitride semiconductor template.

2. Description of the Related Art

Nitride-based compound semiconductors such as gallium nitride (GaN), aluminum gallium nitride (AlGaN) and indium gallium nitride (InGaN) have received attention as a light-emitting element material capable of emitting light from red to ultraviolet. One of crystal growth methods of such nitride semiconductor materials is a Hydride Vapor Phase Epitaxy (HVPE) method in which metal chloride gas and ammonia are used as raw materials.

The HVPE method is characterized in that it is possible to obtain a growth rate of not less than 10 μm/hr and not more than 100 μm/hr which is much faster than a typical growth rate of several μm/hr obtained by other growth methods (Metal-Organic Vapor Phase Epitaxy (MOVPE) method or Molecular Beam Epitaxy (MBE) method). Therefore, the HVPE method is often used for manufacturing a GaN free-standing substrate (see Japanese Patent Application No. 3886341) or an AlN free-standing substrate. The "free-standing substrate" here refers to a substrate which can maintain its shape and has a strength which does not cause inconvenience for handling.

Meanwhile, a light-emitting diode (LED) made of nitride semiconductor is generally formed on a sapphire substrate. For the crystal growth thereof a buffer layer is formed on a surface of the sapphire substrate, a thick GaN layer of about 10 to 15 μm including an n-layer is subsequently grown thereon, and then, a light-emitting layer of InGaN/GaN multiple quantum well (total thickness of several hundred nm) and p-layer (thickness of 200 to 500 nm) are grown thereon in this order. The reason why the GaN layer under the light-emitting layer is thick is, e.g., to improve crystalline characteristics of GaN on the sapphire substrate. After that, electrodes, etc., are formed, thereby eventually forming a below-described element structure shown in FIG. 4. In case of growing by the MOVPE method, the crystal growth process typically takes about 6 hours, about half of which is time required for growing the GaN layer, called template, formed under the light-emitting layer.

Based on the above, it is possible to significantly reduce growth time and thus to drastically reduce the manufacturing cost of LED wafer if the HVPE method providing a considerably fast growth rate can be applied to growth of a template portion.

Meanwhile, for example, JP-A2002-280611 is a method of improving light extraction efficiency by reducing optical confinement in a semiconductor light-emitting element (light-emitting diode).

In JP-A 2002-280611, a first layer is embossing-processed to increase light extraction efficiency, thereby enhancing brightness. Meanwhile, in JP-A 2005-183997, the same effect is obtained by an embossing process on a substrate. In JP-A 2005-183997, so called PSS (Patterned Sapphire Substrate) is used to increase light extraction efficiency and thereby to enhance brightness.

Meanwhile, the template portion needs to have low resistance since it is a portion where electric current flows in a horizontal direction. This is required because drive voltage (forward voltage) of LED increases unless resistance is low. That is, the template portion is an important portion which has a function of reducing defects in an active layer by improving crystalline characteristics to enhance internal quantum efficiency and a function of reducing forward voltage.

SUMMARY OF THE INVENTION

A typical method of reducing resistance is to increase a carrier concentration by increasing an amount of impurity to be added. In this method, the amount of impurity to be added is increased to increase the carrier concentration of an upper portion of the uppermost layer of the nitride semiconductor template portion. However, increasing the amount of impurity added to the uppermost layer deteriorates crystalline characteristics, which results in a decrease in brightness of the light-emitting diode. Here, in general, a half-value width (FWHM) at a (0004) plane by X-ray diffraction (XRD) measurement (hereinafter, referred to as "XRD half-value width") is use as an index of crystalline characteristics. In addition, when the impurity amount is large, brightness is reduced due to dopant diffusion into a light-emitting portion, especially into an active layer, formed on the template and reliability decreases due to the dopant diffusion. Therefore, it is desirable that the nitride semiconductor template have good crystalline characteristics and low resistance.

However, in order to reduce resistance, it is necessary to add a certain amount of impurity. If the impurity is increased to increase the carrier concentration, the impurity in the nitride semiconductor template is diffused into the light-emitting layer during growth of the light-emitting layer portion by the MOVPE method performed later on, which decreases reliability as LED.

In the present specification and claims attached, "a nitride semiconductor template" or simply "a template" means to include a substrate as well as a nitride semiconductor layer, such as GaN layer or buffer layer, formed under the light-emitting layer. In addition, the above-mentioned template portion means a nitride semiconductor layer in "the nitride semiconductor template".

It is an object of the invention to provide a nitride semiconductor template having low resistance and good crystalline characteristics, and a light-emitting diode using the nitride semiconductor template.

As a result of intense study to achieve the above-mentioned object, the inventors found that island growth in the initial growth allows dislocation density to be reduced. In addition, it was found that planes with various orientations appear during the island growth and, when an inclined surface is present, doping efficiency of O (oxygen) is good. In other words, it is possible to reduce the amount of additive as a cause of defect formation by the finding good doping efficiency. Accordingly, O (oxygen) as an n-type additive can be added in a good condition without deterioration of crystalline characteristics, and it is thus possible to reduce resistance to some extent. It is possible to further reduce the amount of additive which is actively added to the n-type doped layer, thereby reducing dislocation density. It was also found that crystalline characteristics of the light-emitting portion formed on the template is improved when, in addition to the above method, an impurity concentration of the uppermost portion of the GaN layer as the outermost layer of the template to be doped with an n-type carrier decreases toward the outermost surface in a gradient manner, and the light-emitting diode manufactured using the template can achieve high brightness. Furthermore, in the light-emitting diode manufactured using the template having such a structure, deterioration due to dopant diffusion from the template does not occur, hence, high reliability.

In other words, a template for nitride semiconductor light-emitting element with less defects, low resistance and less dopant diffusion was successfully provided using the HVPE method. As a result, it is possible to manufacture a light-emitting diode with high brightness and excellent in reliability at low cost.

(1) According to one embodiment of the invention, a nitride semiconductor template comprises:

a substrate; and a group III nitride semiconductor layer formed on the substrate and comprising a Si-doped layer doped with Si as an uppermost layer thereof, wherein the group III nitride semiconductor layer has a total thickness of not less than 4 µm and not more than 10 µm, and wherein the Si-doped layer comprises a Si concentration gradient layer having a carrier concentration that gradually decreases toward an outermost surface thereof so as to be not less than $1 \times 10^{17}$ cm$^{-3}$ and not more than $5 \times 10^{17}$ cm$^{-3}$ at the outermost surface of the group III nitride semiconductor layer.

In the above embodiment (1) of the invention, the following modifications and changes can be made.

(i) The group III nitride semiconductor layer comprises an O-doped layer doped with O (oxygen) between the substrate and the Si-doped layer.

(ii) The O-doped layer has an O-impurity concentration of not less than $1 \times 10^{16}$ cm$^{-3}$ and not more than $3 \times 10^{19}$ cm$^{-3}$ and an average carrier concentration in a thickness direction of not less than $8 \times 10^{17}$ cm$^{-3}$ and not more than $1 \times 10^{18}$ cm$^{-3}$.

(iii) The Si-doped layer comprises a high Si concentration layer having a uniform carrier concentration in a thickness direction, and wherein the Si concentration gradient layer has a carrier concentration that gradually decreases from the high Si concentration layer toward the outermost surface, (iv) The carrier concentration of the high Si concentration layer is not less than $1 \times 10^{17}$ cm$^{-3}$ and not more than $1 \times 10^{19}$ cm$^{-3}$.

(v) The substrate comprises a PSS (Patterned Sapphire Substrate) comprising a plurality of convex portions on a surface thereof.

(vi) The nitride semiconductor template has a surface resistivity of not less than 10 Ω/sq and not more than 30 Ω/sq.

(vii) The nitride semiconductor template has a half-value width at a (0004) plane of not more than 100 seconds by X-ray diffraction measurement.

(2) According to another embodiment of the invention, a light-emitting diode comprises:

a sapphire substrate;

an AlN buffer layer formed on the sapphire substrate;

an n-type group III nitride semiconductor layer formed on the AlN buffer layer;

a multiple quantum well layer formed on the n-type group III nitride semiconductor layer;

a p-type nitride semiconductor layer formed on the multiple quantum well layer;

an exposed portion of the n-type group III nitride semiconductor layer formed by etching from the p-type nitride semiconductor layer to the n-type group II nitride semiconductor layer;

an n-type electrode formed on the exposed portion of the n-type group III nitride semiconductor layer; and a p-type electrode formed on the p-type nitride semiconductor layer, wherein the n-type group III nitride semiconductor layer comprises a group III nitride semiconductor layer comprising a Si-doped layer doped with Si as an uppermost layer thereof, wherein the group III nitride semiconductor layer has a total thickness of not less than 4 µm and not more than 10 µm, and wherein the Si-doped layer comprises a Si concentration gradient layer having a carrier concentration that gradually decreases toward an outermost surface thereof so as to be not less than $1 \times 10^{17}$ cm$^{-3}$ and not more than $5 \times 10^{17}$ cm$^{-3}$ at the outermost surface of the group III nitride semiconductor layer.

The epitaxial layer of the group II nitride semiconductor layer may include two or more dopants therein. The group III nitride semiconductor layer may include GaN as a main component. In the nitride semiconductor template, an AlN buffer layer may be preferably formed between the layer including GaN as the main component. The AlN buffer layer may preferably have a thickness of not less than 10 nm and not more than 100 nm.

The substrate may use the PSS substrate with convex portions on the surface or a planar substrate without the convex portions on the surface. Even in using the planar substrate, the same effects can be obtained by the initial island growth. In case of using as the substrate the PSS substrate with the convex portions on the surface, the half-value width at a (0004) plane by X-ray diffraction measurement may be preferably not more than 100 seconds. In case of using as the substrate the planar substrate without the convex portions on the surface, the half-value width at a (0004) plane by X-ray diffraction measurement may be preferably not more than 300 seconds. The pitch p of the convex portions may be preferably not less than 0.5 µm and not more than 6.0 µm, and the height h of the convex portion may be preferably not less than 0.5 µm and not more than 3.0 µm, The group III nitride semiconductor layer may be preferably grown by the HVPE (hydride vapor phase epitaxy) method. The buffer layer may be grown by the other method than the HVPE method. The group III nitride semiconductor layer may be preferably grown at a growth rate of 30 to 300 µm/hr.

Effects of the Invention

According to one embodiment of the invention, where a substrate (PSS substrate) with convex portions formed on a surface thereof is used as a substrate, it is possible to provide a nitride semiconductor template having low resistance (surface resistivity of not more than 30 Ω/sq) and good crystalline characteristics (XRD half-value width of not less than 50 seconds and not more than 100 seconds), and a light-emitting diode using thereof. In addition, in case of using a planar substrate not having convex portions on a surface thereof (a substrate other than the PSS substrate), it is possible to provide a nitride semiconductor template having low resistance (surface resistivity of not more than 30 Ω/sq) and good crystalline characteristics (XRD half-value width of not less than 50 seconds and not more than 300 seconds), and a light-emitting diode using thereof.

BRIEF DESCRIPTION OF THE DRAWINGS

Next, the present invention will be explained in more detail in conjunction with appended drawings, wherein.

DETAILED DESCRIPTION OF THE PREFERRED EMBODIMENTS

Figure 1A:
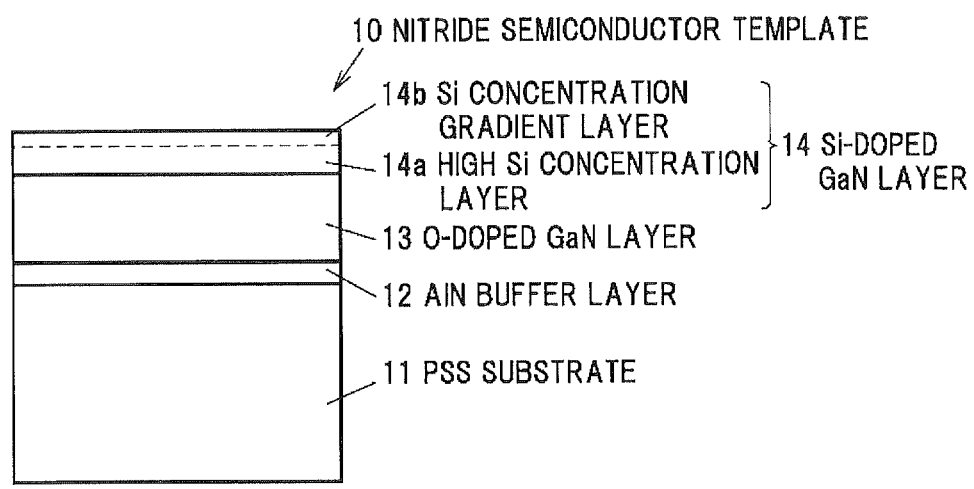
FIG. 1A is a cross sectional view showing a nitride semiconductor template in a first embodiment of the present invention and FIG. 1B is a principal-portion cross sectional view showing a surface state of a substrate.

Embodiments of the invention will be described below in reference to the drawings. It should be noted that constituent elements having substantially the same functions are denoted by the same reference numerals in each drawing and the overlapping explanation thereof will be omitted.

Summary of the Embodiment

A nitride semiconductor template in the present embodiments is provided with a substrate and a group III nitride semiconductor layer formed on the substrate and having a Si-doped layer as the outermost layer to which Si is added, wherein the group III nitride semiconductor layer has a total thickness of not less than 4 μm and not more than 10 μm, and the Si-doped layer has a Si concentration gradient layer having a carrier concentration which gradually decreases toward an outermost surface so as to be not less than $1\times10^{17}$ cm$^{-3}$ and not more than $5\times10^{17}$ cm$^{-3}$ at the outermost surface of the group III nitride semiconductor layer.

The nitride semiconductor template is composed of a hetero-substrate and plural nitride semiconductor layers which are formed on the hetero-substrate and are each formed of a material similar to each other but different from the material of the hetero-substrate. Since the group III nitride semiconductor layer has the total thickness of not less than 4 μm and not more than 10 μm and the carrier concentration in the Si concentration gradient layer of the Si-doped layer gradually decreases toward the outermost surface so as to be not less than $1\times10^{17}$ cm$^{-3}$ and not more than $5\times10^{17}$ cm$^{-3}$ at the outermost surface, it is possible to reduce resistance and thus to provide good crystalline characteristics. A light-emitting diode using this nitride semiconductor template has an improved reliability.

First Embodiment

Figure 1B:
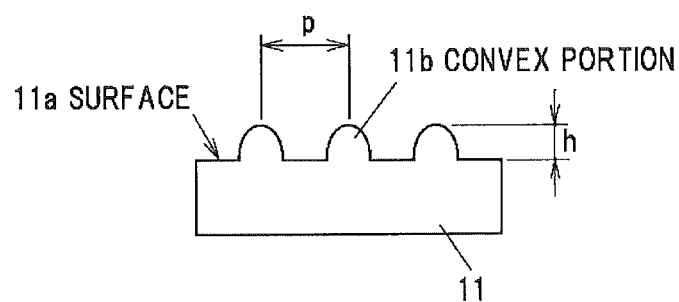

FIG. 1A is a cross sectional view showing a nitride semiconductor template in a first embodiment of the invention and FIG. 1B is a principal-portion cross sectional view showing a surface state of a substrate.

A nitride semiconductor template 10 has a sapphire substrate with a patterned surface, i.e., a PSS (Patterned Sapphire Substrate) 11, and an AlN buffer layer 12 as a buffer layer formed on the PSS substrate 11, an O-doped GaN layer 13 as a first layer which is an O-doped layer doped with O (oxygen) and is formed on the AlN buffer layer 12, and a Si-doped GaN layer 14 as a second layer (the uppermost layer) which is a Si-doped layer doped with silicon (Si) and is formed on the O-doped GaN layer 13.

The Si-doped GaN layer 14 is provided with a high Si concentration layer 14a having a region in which a carrier concentration is uniform in a thickness direction, and a Si concentration gradient layer 14b having a carrier concentration which gradually decreases from the high Si concentration layer 14a toward the outermost surface. The O-doped GaN layer 13 and the Si-doped GaN layer 14 are examples of the group III nitride semiconductor layer (nitride semiconductor template portion).

From the viewpoint of reducing dislocation density due to island growth, the PSS substrate 11 has plural convex portions 11b on a surface 11a as shown in FIG. 1B. A preferred pitch of the convex portions 11b is 0.5 to 6.0 μm. In addition, a height h of the convex portion 11b is preferably 0.5 to 3.0 μm, and more preferably 0.8 to 2.5 μm. The convex portion 11b only needs to have a convex shape and may be, e.g., a pyramid shape, a circular cone shape or a hemispherical shape. The meaning of the numerical range of the convex portion 11b will be described later.

From the viewpoint of reducing crystal defects, a preferred film thickness of the AlN buffer layer 12 is 10 to 100 nm. The meaning of the numerical range of the film thickness will be described later.

From the viewpoint of crystalline characteristics and reduction of resistance, the total thickness of the first and second GaN layers (the O-doped GaN layer 13 and the Si-doped GaN layer 14) is preferably not less than 4 μm and not more than 10 μm, and more preferably not less than 5 μm and not more than 9 μm. In addition, from the viewpoint of reducing operating voltage, etc., surface resistivity of the entire nitride semiconductor template 10 (the entire epi layer) is preferably not less than 10 Ω/sq and not more than 30 Ω/sq.

From the viewpoint of crystalline characteristics and reduction of resistance, an O (oxygen) impurity in the O-doped GaN layer 13 is preferably from $1\times10^{16}$ cm$^{-3}$ to $3\times10^{19}$ cm$^{-3}$, and more preferably from $0.9\times10^{18}$ cm$^{-3}$ to $3\times10^{19}$ cm$^{-3}$. Particularly, the maximum concentration of the O (oxygen) impurity contained in the O-doped GaN layer 13 is preferably from $0.9\times10^{18}$ to $3\times10^{19}$ cm$^{-3}$. The average carrier concentration of the O-doped GaN layer 13 is preferably from $8\times10^{17}$ cm$^{-3}$ to $1\times10^{18}$ cm$^{-3}$.

From the viewpoint of crystalline characteristics and reduction of resistance, a carrier concentration of the high Si concentration layer 14a is preferably from $1\times10^{17}$ cm$^{-3}$ to $1\times10^{19}$ cm$^{-3}$, and more preferably from $1\times10^{18}$ cm$^{-3}$ to $4\times10^{18}$ cm$^{-3}$, The carrier concentration on the outermost surface of the Si concentration gradient layer 14b is preferably from $1\times10^{17}$ cm$^{-3}$ to $5\times10^{17}$ cm$^{-3}$ from the viewpoint of crystalline characteristics, reduction of resistance, and reduction of operating voltage and reliability after completing a light-emitting diode. This is because, if the carrier concentration is too low, resistance increases between the Si concentration gradient layer 14b and an n-type nitride semiconductor layer to be grown on the nitride semiconductor template, which increases drive voltage, so-called forward voltage, for operating the light-emitting diode.

The film thickness of the Si concentration gradient layer 14b is preferably from 0.3 μm to 1.5 μm, and more preferably from 0.5 μm to 1.0 μm from the viewpoint of reduction of resistance, and reduction of operating voltage and enhancement of reliability after completing a light-emitting diode.

Meaning of Numerical Range of Convex Portion of Substrate

When the pitch p of the convex portions 11b on the surface of the PSS substrate 11 is too narrow, a half-value width (FWHM) at a (0004) plane by X-ray diffraction (XRD) (hereinafter, referred to as "XRD half-value width") which is an index of crystalline characteristics is less likely to be narrow. In other words, it is difficult to improve crystalline characteristics. The cause thereof is that initial island growth is reduced and flattening occurs rapidly. Meanwhile, when the pitch p of the convex portions 11b is too large, pits are likely to be generated. The pit is a cause of deteriorating characteristics of the light-emitting diode which is manufactured later on.

When the height h of the convex portion is too low, the XRD half-value width is less likely to be narrow. This is because the same effect as during the island growth occurs when the height h of the convex portion 11b is higher. Conversely, when the height h of the convex portion 11b is too high, flattening is less likely to occur and the pits are thus likely to be generated. Accordingly, it is necessary to grow a thick film in order to eliminate the pits. The large film thickness causes a problem of increasing warping of a wafer. If the film thickness is further increased, crystal is broken. This means that cracks are generated in the epi layer, and it is an influence of lattice mismatch with the PSS substrate 11 as a hetero-substrate.

Therefore, the pitch p of the convex portions 11b is preferably from 0.5 to 6.0 μm, and more preferably from 1.0 to 5.0 μm. In addition, the height h of the convex portion 11b is preferably from 0.5 to 3.0 μm, and more preferably from 0.8 to 2.5 μm.

Meaning of Numerical Range of AlN Buffer Layer

If the AlN buffer layer 12 is too thin or too thick, the XRD half-value width as an index of crystalline characteristics tends to be wide due to an increase in the number of crystal defects. In other words, the crystalline characteristics tend to decrease. Especially when the AlN buffer layer 12 is too thin, it is difficult to grow the O-doped GaN layer 13 thereon. Therefore, the film thickness of the AlN buffer layer 12 needs to be at the above-mentioned appropriate level.

Meaning of Numerical Range of Film Thickness

Following is the reason for defining the total thickness of the O-doped GaN layer 13 as the first layer and the Si-doped GaN layer 14 as the second layer. If the total thickness of the O-doped GaN layer 13 as the first layer and the Si-doped GaN layer 14 as the second layer is smaller than 4 μm, a problem arises in that pit-shaped recesses are formed on the surface. In addition, it is difficult to reduce resistance unless a high concentration of additive is added. That is, it is not possible to manufacture a semiconductor light-emitting element (light-emitting diode) in which forward voltage as drive voltage is sufficiently low. It is possible to reduce resistance if the carrier concentration is increased by increasing the amount of additive in order to sufficiently reduce forward voltage, however, the increase in the amount of additive deteriorates crystalline characteristics and it is thus not possible to manufacture a semiconductor light-emitting element (light-emitting diode) with high brightness. The XRD half-value width which is 300 seconds in a planar substrate and greater than 100 seconds in the PSS substrate also shows that many defects are present.

On the other hand, if the total thickness of the O-doped GaN layer 13 and the Si-doped GaN layer 14 is greater than 10 μm, there is a problem that cracks are generated in the epi layer since the substrate and the epi layer are formed of different materials. It is obvious that the nitride semiconductor template with cracks cannot be used for a semiconductor light-emitting element (light-emitting diode). However, it is possible to suppress cracks if growth conditions, etc., are changed somehow. Therefore, under certain growth conditions, it is possible to reduce resistance to prevent forward voltage from rising without increasing the amount of additive, i.e., without increasing the carrier concentration. In addition, it is possible to improve crystalline characteristics. In other words, it is possible to narrow the XRD half-value width and it is thus possible to manufacture a nitride semiconductor template for semiconductor light-emitting element (light-emitting diode) which has good crystalline characteristics. However, a large film thickness causes a problem in that warping of a wafer increases. The cause of the warping is that the substrate and the epi layer are formed of different materials. Large warping of the template causes a problem in the growth of the light-emitting portion which is grown on the template. The problem is, e.g., a decrease in light emission output. In addition, in-plane distribution of emission wavelength of the semiconductor light-emitting element (light-emitting diode) is deteriorated due to the influence of the warping, which causes a decrease in a yield. This occurs because a concentration of In used in an MQW layer as an active layer becomes non-uniform in a plane due to the warping of the template. Furthermore, there is a problem that more manufacturing cost is obviously required to increase the film thickness.

If the Si concentration gradient layer 14b is too thick, forward voltage becomes high after completing the semiconductor light-emitting element (light-emitting diode). This is caused by an increase in series resistance. If the Si concentration gradient layer 14b is too thin in an opposite manner, Si in the Si concentration gradient layer 14b or the high Si concentration layer 14a is diffused into the light-emitting portion during the growth thereof and defects are formed in the light-emitting portion due to influence of the diffusion. Therefore, a decrease in light emission output occurs after completing the semiconductor light-emitting element (light-emitting diode). Then, the decrease in light emission output significantly decreases reliability.

Based on the above, the total film thickness of the O-doped GaN layer 13 as the first layer and the Si-doped GaN layer 14 as the second layer is preferably from 4 μm to 10 μm and, when taking reproducibility into consideration, 5 to 9 μm is more preferable. In addition, the film thickness of the Si concentration gradient layer 14b is preferably from 0.3 to 1.5 μm, and more preferably from 0.5 μm to 1.0 μm.

Meaning of Numerical Range of Carrier Concentration and Impurity Concentration

A too high carrier concentration, i.e., impurity concentration causes deterioration of crystalline characteristics, and accordingly, the XRD half-value width is not narrowed. In other words, crystal defects are not sufficiently reduced. On the other hand, when the carrier concentration is too low, surface resistivity does not decrease. Therefore, the carrier concentration and the impurity concentration of the O-doped GaN layer 13 as the first layer and the Si-doped GaN layer 14 as the second layer are preferably within the above-mentioned ranges.

If the carrier concentration on the outermost surface of the Si concentration gradient layer 14b which is a surface to be in contact with the n-type nitride semiconductor layer is too high, crystalline characteristics decrease and the XRD half-value width is not narrowed. In other words, crystal defects are not sufficiently reduced. On the other hand, a too low carrier concentration increases contact resistance with the n-type nitride semiconductor layer, resulting in high forward voltage after completing the semiconductor light-emitting element (light-emitting diode). Therefore, the carrier concentration of the portion of the Si concentration gradient layer 14b in contact with the n-type nitride semiconductor layer is preferably within the above-mentioned range. One of carrier concentration evaluation methods is based on evaluation by the Van der Pauw method. A carrier concentration evaluated by Van der Pauw method is an average carrier concentration of the entire epitaxial layer. For example, when the carrier concentration which varies in a film is evaluated by the Van der Pauw method, an average carrier concentration of the film is obtained. Another carrier concentration evaluation method is CV method. While the Van der Pauw method is to measure the average carrier concentration of the entire film, the CV method is a method to measure a carrier concentration of the surface. The carrier concentration of the surface of the Si concentration gradient layer 14b is measured by the CV method. The Si-impurity concentration and the O-impurity concentration can be calculated based on SIMS (Secondary Ion Mass Spectrometry) analysis.

The reason why the carrier concentration of the Si concentration gradient layer 14b is gradient is that forward voltage after completing the semiconductor light-emitting element (light-emitting diode) is lower than a graded (stepwise) concentration.

Meaning of Numerical Range of Surface Resistivity of Template

The surface resistivity of the entire nitride semiconductor template 10 should be not more than 30 Ω/sq within the above-mentioned preferred ranges of the carrier concentration and the film thickness. The more preferred surface resistivity of the entire nitride semiconductor template 10 is 10 to 30 Ω/sq. Too low surface resistivity degrades crystals. On the other hand, too high surface resistivity increases forward voltage after completing the semiconductor light-emitting element (light-emitting diode).

Manufacturing Method

The nitride semiconductor template 10 is preferably grown by the HVPE method, and the growth rate thereof is preferably 30 to 300 μm/hr, and more preferably 30 to 200 μm/hr. Growth by the HVPE method allows cost reduction since the raw material cost is low and the growth rate is fast (in comparison to the MOVPE method and the MBE method). The growth rate is determined to be 30 to 300 μm/hr since too fast growth rate causes difficulty in control and poor reproducibility. In case of forming the film by the HVPE method, GaCl is produced using a gas such as hydrogen chloride (HCl) as a raw material, and a GaN film is subsequently formed using the GaCl as a Ga source. Accordingly, in the growth by the HVPE method, a slight amount of Cl is inevitably mixed into the epi layer. Therefore, by analyzing Cl in the epi layer, it is possible to confirm that the HVPE method is used for film formation. Use of the HVPE method can be identified since Cl is not mixed into the epi layer when other methods such as the MOVPE method are used for growth.

It is very difficult to grow the AlN buffer layer 12 by the HVPE method. Therefore, the MOVEP method excellent in controllability can be used only for forming the AlN buffer layer 12, then using the HVPE method for the following growth. However, in light of the cost, all layers should be grown by the HVPE method as is the first embodiment.

Effects of the Embodiment

The first embodiment achieves the following effects.

(a) Since it is possible to achieve low resistance and defect reduction, it is possible to reduce forward voltage and to improve light extraction efficiency. In addition, due to the structure in which diffusion of additive is suppressed, it is possible to manufacture a nitride semiconductor template which can be suitably used for application in a highly efficient semiconductor light-emitting element.

(b) Since all layers of the nitride semiconductor template are formed by the HVPE method, it is possible to significantly reduce growth time. Therefore, it is possible to provide a high-performance nitride semiconductor template at low cost. In other words, this nitride semiconductor template is useful for a highly reliable semiconductor light-emitting element (light-emitting diode) with high brightness.

Second Embodiment

Figure 2A:
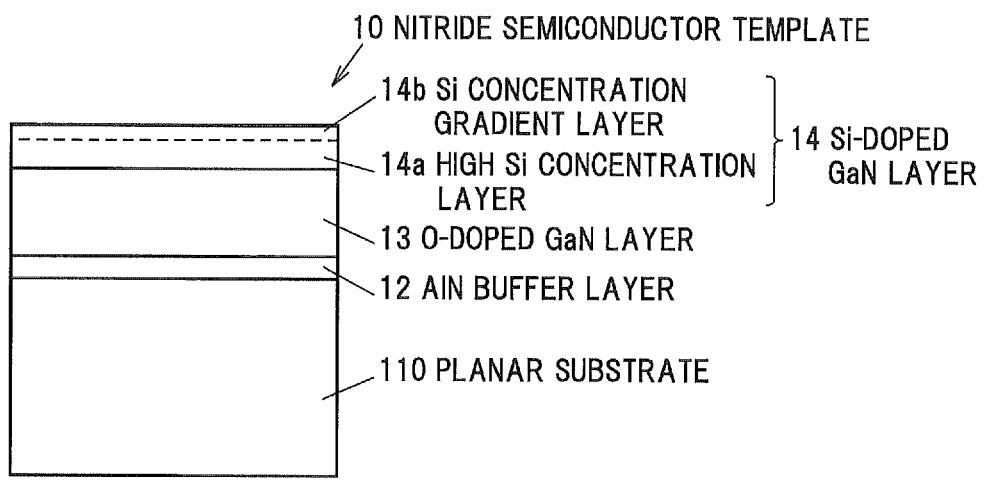
FIG. 2A is a cross sectional view showing a nitride semiconductor template in a second embodiment of the invention and FIG. 2B is a principal-portion cross sectional view showing a surface state of a substrate.
Figure 2B:
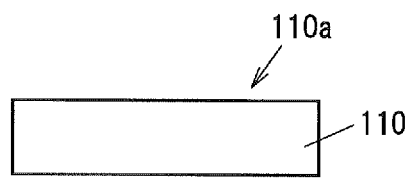

FIG. 2A is a cross sectional view showing a nitride semiconductor template in a second embodiment of the invention. It is basically the same as the cross sectional view of the nitride semiconductor template in the first embodiment of the invention shown in FIG. 1A. FIG. 2B is a principal-portion cross sectional view showing a surface state of a substrate. The second embodiment is different from the first embodiment in that a planar substrate 110 which is flat without having convex portions 11b on a surface 110a is used as a substrate. For example, a sapphire substrate is used as the planar substrate 110.

Third Embodiment

Figure 3:
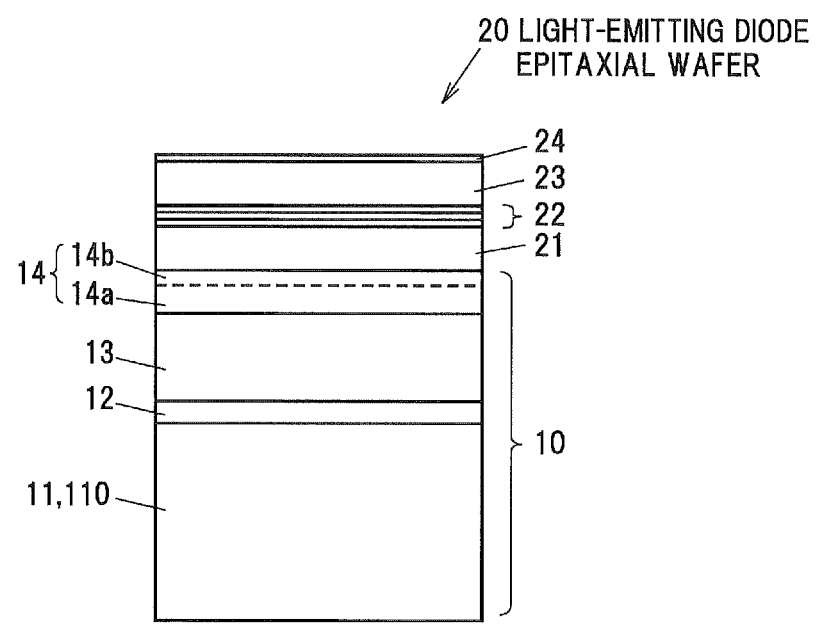
FIG. 3 is a cross sectional view showing a light-emitting diode epitaxial wafer in a third embodiment of the invention.

FIG. 3 is a cross sectional view showing a light-emitting diode epitaxial wafer in a third embodiment of the invention. In a light-emitting diode epitaxial wafer 20 in the third embodiment, an n-type GaN layer 21 is grown on the nitride semiconductor template 10 shown in FIG. 1 or 2, six pairs of InGaN/GaN multiple quantum well layers 22 are grown thereon, and a p-type AlGaN layer 23 and a p-type GaN contact layer 24 are grown thereon. The structures shown in FIGS. 1 and 2 here are examples of the nitride semiconductor template. The n-type GaN layer 21 is an example of the n-type nitride semiconductor layer. The p-type AlGaN layer 23 and the p-type GaN contact layer 24 are examples of a p-type nitride semiconductor layer.

Fourth Embodiment

Figure 4:
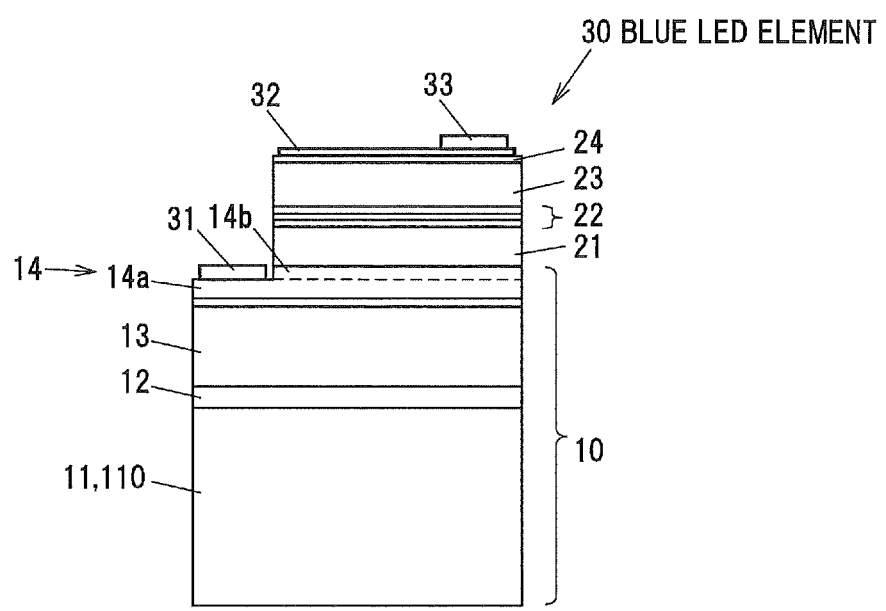
FIG. 4 is a cross sectional view showing a light-emitting diode in a fourth embodiment of the invention.

FIG. 4 is a cross sectional view showing a light-emitting diode in a fourth embodiment of the invention. In a blue LED element 30 as a light-emitting diode, a surface of the light-emitting diode epitaxial wafer 20 shown in FIG. 3 is partially removed, a Ti/Al electrode 31 as an n-type electrode is formed on an exposed portion formed by exposing a portion of the Si concentration gradient layer 14b of the nitride semiconductor template 10, and a Ni/Au translucent electrode 32 and an electrode pad 33 as p-type electrodes are formed on the p-type GaN contact layer 24.

Although the invention will be described in more detail below in reference to Examples, the invention is not intended to be limited thereto.

EXAMPLE 1

Figure 5:
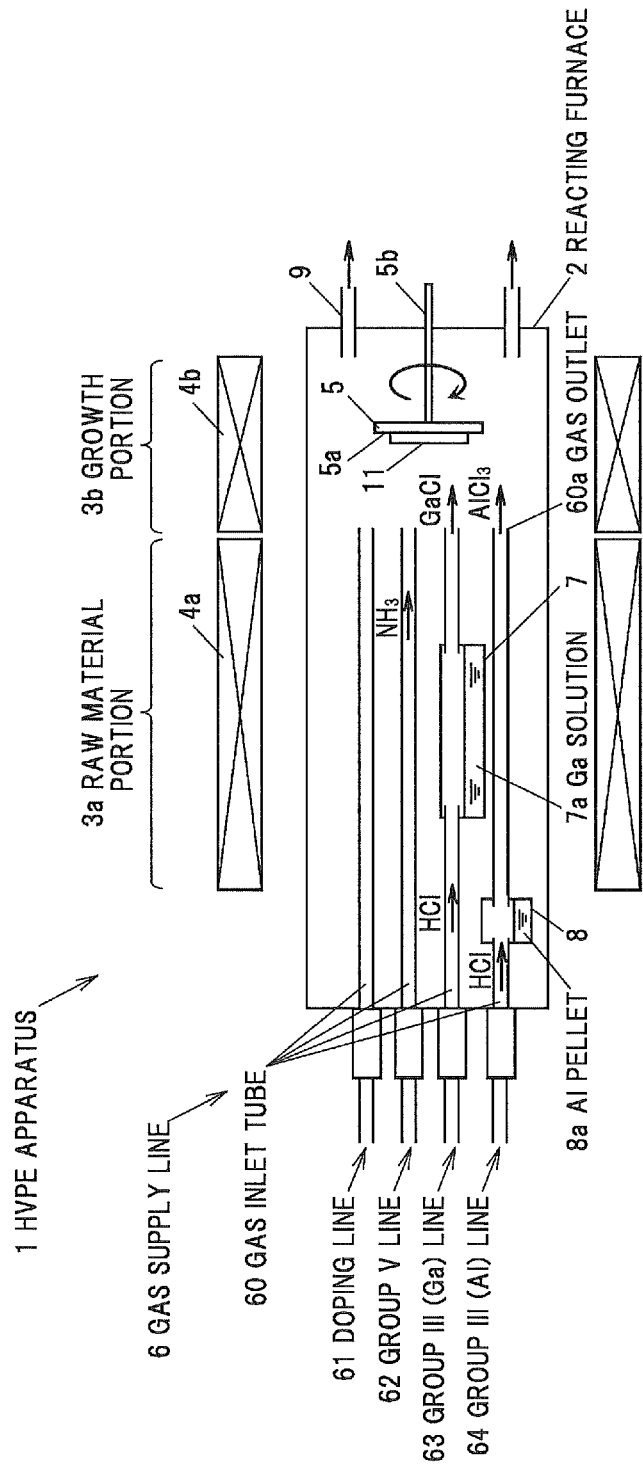
FIG. 5 is a schematic view showing a structural example of an HVPE apparatus in Examples.

FIG. 5 is a schematic view showing a structural example of an HVPE apparatus in Examples of the invention. In Example 1, 20 nm of the AlN buffer layer 12 was grown on the PSS substrate 11 using an HVPE apparatus 1 shown in FIG. 5, 6 µm of the O-doped GaN layer 13 was subsequently grown after the growth of the AlN buffer layer 12, and 2 µm of the Si-doped GaN layer 14 was further grown thereon. 0.5 µm of the outermost layer of the Si-doped GaN layer 14 was grown while changing the additive amount of Si. The layer formed while gradually reducing the additive amount of Si is the Si concentration gradient layer 14b. The HVPE apparatus 1 is divided into a raw material portion 3a located at upstream and a growth portion 3b located at downstream, which are respectively heated to about 850° C. and 1100° C. respectively by a raw material portion heater 4a and a growth portion heater 4b.

Four gas supply lines 6, which are a doping line 61, a group V line 62, a group III (Ga) line 63 and a group III (Al) line 64, are placed so as to be directed from the raw material portion 3a toward the growth portion 3b. Hydrogen, nitrogen or a mixture gas of hydrogen and nitrogen is introduce through the doping line 61 during the growth of, e.g., an undoped GaN layer (un-GaN layer) when, e.g., doping is not carried out. In case of, e.g., the Si-doped layer, dichlorosilane as a Si source (hydrogen dilution: 100 ppm), HCl gas, and hydrogen or nitrogen or a mixture gas of hydrogen and nitrogen are introduced during the growth of the n-type GaN layer. Hydrogen, nitrogen or a mixture gas of hydrogen and nitrogen as a carrier gas is supplied, together with ammonia ($NH_3$) as a raw material, through the group V line 62. A Ga tank 7 containing a gallium (Ga) solution 7a is provided on the group III (Ga) line 63, where a GaCl gas as a group III raw material is produced by a reaction of HCl gas with metal gallium and is fed to the growth portion 3b. In addition to HCl, hydrogen or nitrogen or a mixture gas of hydrogen and nitrogen as a carrier gas is supplied to the group III (Ga) line 63. An Al tank 8 containing an aluminum (Al) pellet 8a is provided on the group II (Al) line 64, where an $AlCl_3$ gas as a group III raw material is produced by a reaction of HCl gas with metal aluminum and is fed to the growth portion 3b. In addition to HCl, hydrogen or nitrogen or a mixture gas of hydrogen and nitrogen as a carrier gas is supplied to the group III (Al) line 64.

The Al tank 8 located on the group III (Al) line 64 and containing the aluminum (Al) pellet 8a is placed at a position where temperature becomes 500 to 600° C. This is because aluminum, if turned into a solution, forms AlCl at the time of reaction with HCl gas and causes corrosion of silica. That is, the Al tank 8 containing the aluminum (Al) pellet 8a is provided in a region with a temperature lower than 660° C. which is a melting point of aluminum.

During baking which is carried out after the growth in order to remove GaN-based deposit attached inside the HVPE apparatus 1, HCl gas and hydrogen and nitrogen gases are introduced through the doping line 61.

A tray 5 rotating at a rotational speed of about 3 to 100 r/min is placed in the growth portion 3b, and the PSS substrate 11 is mounted on a surface (mounting surface) 5a which faces outlets of the gas supply lines 6. The gas flowing beyond the PSS substrate 11 is evacuated from the most downstream portion through an exhaust pipe 9. Substantially all of growth in Example 1 was carried out at an ordinary pressure (1 atmospheric pressure).

The gas supply lines 6, the tanks 7, 8 and a tray rotating shaft 5b are made of high purity silica, and the tray 5 is made of carbon coated with SiC.

(1) Preparation of Substrate

The PSS substrate 11 used here has a thickness of 900 µm, a diameter of 100 mm (4 inches) and the convex portions 11b arranged at the pitch p of 2.5 µm and each having the height h of 1.5 µm.

(2) HVPE Growth

The HVPE growth was carried out as follows. After the PSS substrate 11 was placed on the tray 5 of the HVPE apparatus 1, the air in a reacting furnace 2 was removed by supplying nitrogen therein. Next, the substrate was kept in a mixture gas of 3 slm of hydrogen and 7 slm of nitrogen at a substrate temperature of 1100° C. for 10 minutes. After that, in order to grow the AlN buffer layer 12, 50 to 500 sccm of HCl gas and 2000 to 2450 sccm of the mixture gas of hydrogen and nitrogen were simultaneously supplied through the group III (Al) line 64. Meanwhile, 50 to 2450 sccm of $NH_3$ and 50 to 2450 sccm of the mixture gas of hydrogen and nitrogen were simultaneously supplied through the group V line 62. 2500 sccm of the mixture gas of hydrogen and nitrogen was introduced into each gas supply line 6 other than the group III (Al) line 64 and the group V line 62. The total flow rate of the gas introduced through the gas supply lines 6 is 10 slm.

Growth time for the AlN buffer layer 12 was 1 minute. The growth time was determined to be 1 minute so that the AlN buffer layer 12 has a film thickness of 20 nm. In this regard, the growth time was determined on the basis of the growth rate derived by growing about 1 µm of the AlN buffer layer 12.

Following the growth of the AlN buffer layer 12, the O-doped GaN layer 13 was grown at the growth rate of 60 µm/hr. As the gas which is supplied at this time, 50 to 500 sccm of HCl gas and 2000 to 2450 sccm of the mixture gas of hydrogen and nitrogen were simultaneously introduced through the group III (Ga) line 63. Meanwhile, 50 to 2450 sccm of $NH_3$ and 50 to 2450 sccm of the mixture gas of hydrogen and nitrogen were simultaneously supplied through the group V line 62. In addition, O (oxygen) was introduced through the doping line 61. The gases supplied through the doping line 61 and the group III (Al) line 64 were each adjusted to 2500 sccm so that the total flow rate is 10 slm. The growth time of the O-doped GaN layer 13 is 10 minutes. The O (oxygen) supply was stopped when about 2 µm of the O-doped GaN layer 13 was grown.

After the growth of the O-doped GaN layer 13, the Si-doped GaN layer 14 was grown for 3.5 minutes basically under the same growth conditions by introducing Si through the doping line 61. The flow rate of the Si source at this time was 75 sccm and the flow rate was, of course, adjusted to 10 slm.

After the high Si concentration layer 14a of the Si-doped GaN layer 14 was grown for 2.5 minutes, the flow rate of the Si source was gradually reduced for the remaining 1 minute to decrease the carrier concentration in a gradient manner. The above-mentioned 1 minute is for growing the Si concentration gradient layer 14b located at the uppermost portion of the Si-doped GaN layer 14. Naturally, nitrogen gas was increased in accordance with variation in the flow rate of the Si source to maintain the total flow rate constant (the total flow rate of 10 slm).

After completing the growth of the Si concentration gradient layer 14b, the substrate was cooled until the substrate temperature becomes room temperature while supplying 2 slm of $NH_3$ as well as maintaining the total flow rate of 10 slm. After that, nitrogen purge was carried out for several ten minutes to fill the reacting furnace 2 with nitrogen atmosphere, and the nitride semiconductor template 10 shown in FIG. 1 was taken out.

The XRD half-value width of the nitride semiconductor template 10 manufactured as described above was 71.6 seconds. Meanwhile, the result of evaluating the surface resistivity of the nitride semiconductor template 10 by using a non-contact resistivity measurement system was 17 Ω/sq.

Furthermore, the carrier concentration of the nitride semiconductor template 10 was measured by the Van der Pauw method and the CV method. As a result, it was confirmed that the average carrier concentration of the entire epitaxial layer of the nitride semiconductor template 10 evaluated by the Van der Pauw method was $1\times10^{18}$ cm$^{-3}$, and the carrier concentration of the Si concentration gradient layer 14b on the surface of the Si-doped GaN layer 14 evaluated by the CV method was $1\times10^{17}$ cm$^{-3}$.

Figure 6:
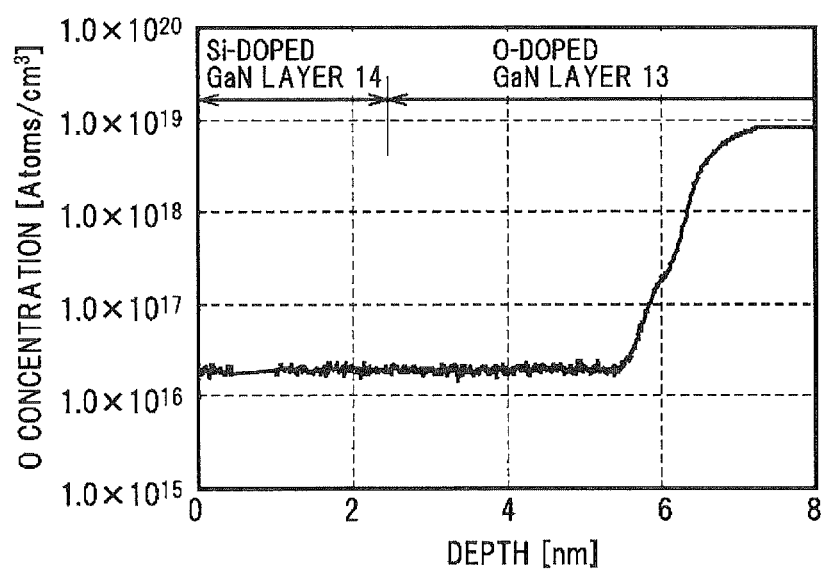
FIG. 6 is a diagram illustrating a profile of an O (oxygen) concentration in a GaN layer of Example 1 by SIMS (Secondary Ion Mass Spectrometry)
Figure 7:
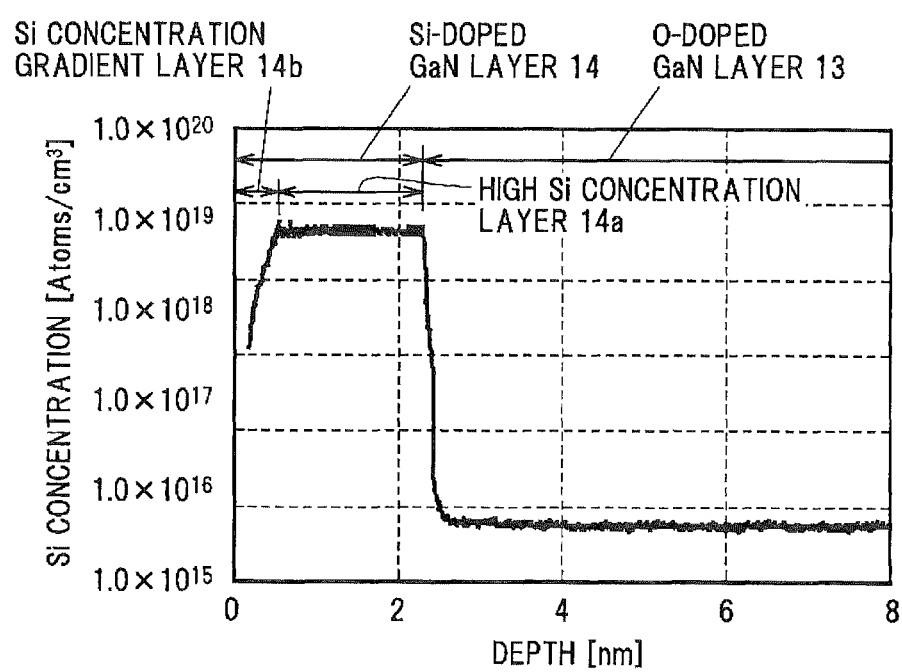
FIG. 7 is a diagram illustrating a profile of a Si (silicon) concentration in the GaN layer of Example 1 by SIMS (Secondary Ion Mass Spectrometry)

FIG. 6 shows a profile of an O (oxygen) concentration in the nitride semiconductor template 10 by SIMS (Secondary Ion Mass Spectrometry) analysis. FIG. 7 shows a profile of a Si (silicon) concentration in the nitride semiconductor template 10 by SIMS. As shown in FIG. 6, the O-impurity concentration was not more than $3\times10^{19}$ cm$^{-3}$. As shown in FIG. 7, the Si-impurity concentration was $7\times10^{18}$ cm$^{-3}$ in a stable portion, gradually decreased from the high Si concentration layer 14a toward the surface in a gradient manner, and was $1\times10^{7}$ cm$^{-3}$ at the outermost surface.

Figure 8:
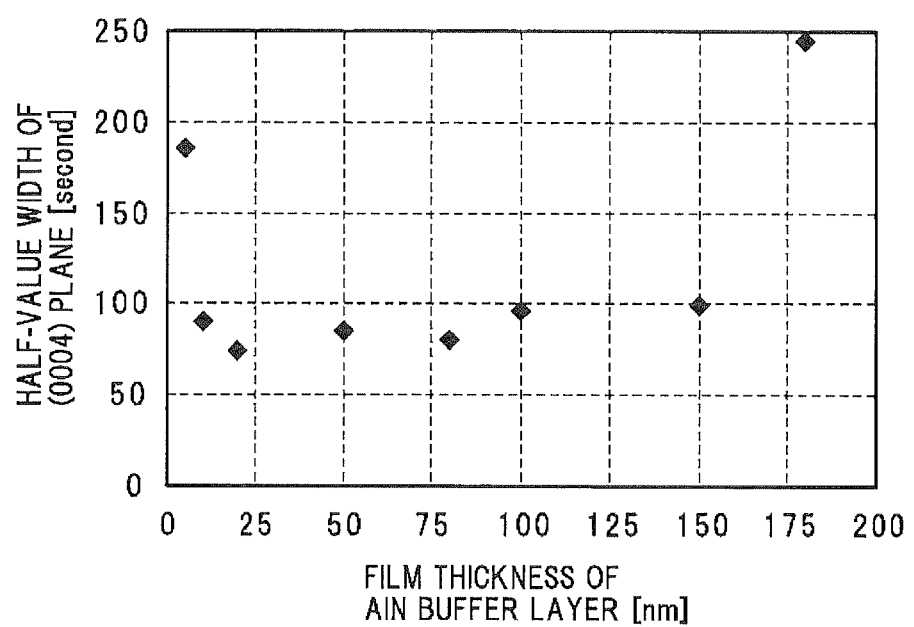
FIG. 8 is a graph showing a relation between a film thickness of an AlN buffer layer and a XRD half-value width in Example 1.

FIG. 8 is a graph showing a relation between a film thickness of the AlN buffer layer 12 and the XRD half-value width. It is understood that, when the film thickness of the AlN buffer layer 12 is from 10 to 150 nm, the XRD half-value width is small which is not more than 100.

Figure 9:
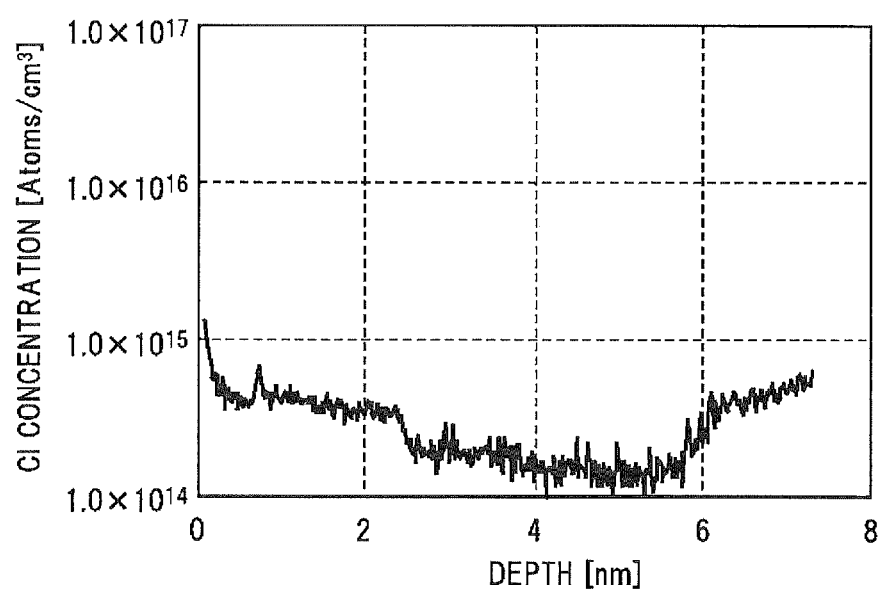
FIG. 9 is a profile showing a SIMS (Secondary Ion Mass Spectrometry) result of a Cl concentration in the nitride semiconductor template of Example 1.

FIG. 9 shows a SIMS analysis result of Cl in the nitride semiconductor template 10 of Example 1. It is understood that the nitride semiconductor template 10 was manufactured by the HVPE method since Cl is present in the epitaxial layer.

(3) Epitaxial Growth for Light-Emitting Diode

The n-type GaN layer 21 was grown on the nitride semiconductor template 10 shown in FIG. 1 and six pairs of the InGaN/GaN multiple quantum well layers 22 were further grown thereon. Furthermore, the p-type AlGaN layer 23 and the p-type GaN contact layer 24 were grown thereon. The aforementioned laminated structure was cooled to around room temperature after the growth thereof, thereby obtaining the light-emitting diode epitaxial wafer 20 shown in FIG. 3. The HVPE method was used for growing the nitride semiconductor template 10, and the MOVPE method was used for the growth of the n-type GaN layer 21 until the growth of the p-type GaN contact layer 24.

(4) Manufacturing of Light-Emitting Diode (LED Element)

A portion of the light-emitting diode epitaxial wafer 20 shown in FIG. 3 on the front surface side was removed by RIE (Reactive Ion Etching) to expose a portion of the Si concentration gradient layer 14b of the nitride semiconductor template 10, and the Ti/Al electrode 31 was formed thereon. The Ni/Au translucent electrode 32 and the electrode pad 33 were further formed on the p-type GaN contact layer 24, thereby making the blue LED element 30 shown in FIG. 4. The detailed manufacturing method will be described later.

Equipments used for a general photolithography process such as resist or mask aligner and a well-known method were used for forming the electrode pattern or the electrode.

Meanwhile, before element isolation, an alloying process which is alloying of electrode was carried out by heat-treating in a nitrogen gas atmosphere at 400° C. for 5 minutes. After that, the light-emitting diode epitaxial wafer 20 on which the electrodes configured as described above are formed was cut using a dicing apparatus, thereby making the blue LED element 30. Then, the blue LED element 30 was mounted on (die-bonded to) a stem, and the mounted blue LED element 30 was further wire-bonded, thereby completing the blue LED element 30.

When light-emitting characteristics of the blue LED element 30 were evaluated at a current of 20 mA, emission peak wavelength was about 450 nm, and forward voltage (drive voltage) of 3.28V and light emission output of 30 mW were achieved. In addition, as a reliability test for the blue LED element 30, a power-on test was conducted for 1000 hours under conditions of room temperature and the current of 50 mA. As a result, relative output (=(light emission output after 1000 hours of electric current conduction/initial light emission output)×100) was 99.8% and did not deteriorate at all, and it was thereby confirmed that the blue LED element 30 has sufficiently good reliability characteristics.

EXAMPLE 2

In Example 2, the nitride semiconductor template 10 was made under the same basal conditions as Example 1. However, some features in Example 2 are different from Example 1. Accordingly, only the difference from Example 1 will be described blow.

In Example 1, the O-doped GaN layer 13 was grown for growth time of 10 minutes so as to have a thickness of about 6 μm. Meanwhile, in Example 2, the O-doped GaN layer 13 was grown for growth time of 13 minutes so as to have a film thickness of about 8 μm. Accordingly, the total film thickness of the epitaxial layer was about 10 μm.

In addition, the gas supplied through the group III (Ga) line 63 was a mixture of 50 sccm of HCl gas, 450 sccm of hydrogen and 2000 sccm of nitrogen in Example 1 but was a mixture of 2000 sccm of hydrogen and 450 sccm of nitrogen in Example 2.

The nitride semiconductor template 10 in Example 2 had a narrow XRD half-value width of 50.1 seconds and surface resistivity of 11 Ω/sq, hence, a better result than Example 1. In addition, it was confirmed that the SIMS analysis result was substantially the same as that in Example 1. In addition, even though the epi layer of the nitride semiconductor template 10 has the large total film thickness of 10 μm in this case, the condition thereof was good without cracks, etc., even though warping increased slightly.

Furthermore, it was confirmed that characteristics of the blue LED element 30 are equivalent to or better than those in Example 1. Especially, forward voltage was lower than Example 1, light emission output was 35 mW which is larger than Example 1, and relative output was 99.6% which is equivalent to Example 1.

EXAMPLE 3

In Example 3, the nitride semiconductor template 10 was made under substantially the same conditions as those in Example 1 so that the carrier concentration on the outermost surface of the Si concentration gradient layer 14b is $5\times10^{17}$ cm$^{-3}$. The nitride semiconductor template 10 in Example 3 had a narrow XRD half-value width of 74.5 seconds and surface resistivity of 15 Ω/sq. The 34 mW of light emission output was achieved and relative output was 99.7%, and therefore, it was confirmed that the blue LED element 30 has sufficient reliability characteristics.

EXAMPLE 4

In Example 4, the test was conducted under substantially the same conditions as those in Example 2, but the O-doped GaN layer 13 has a small film thickness of about 4 μm. In the nitride semiconductor template 10 of Example 4, a good result was obtained such that the XRD half-value width was 86.9 seconds even though surface resistivity was 28 Ω/sq which shows slight deterioration. Meanwhile, the results of the characteristics of the blue LED element 30 were substantially the same as Example 2, such that 35 mW of light emission output was achieved and relative output was 100.1% even though forward voltage increased slightly.

EXAMPLE 5

The same test as conducted in Example 1 was conducted on the PSS substrate 11 having the convex portions 11b arranged at the pitch p of 0.5 to 6.0 μm and having the height h of 0.5 to 3.0 μm. As a result, in Example 5, the nitride semiconductor template had a XRD half-value width of 71.6 seconds and surface resistivity of 17 Ω/sq, which is a good result. In addition, similarly to Example 1, the good results were obtained for the characteristics of the blue LED element 30, such that 30 mW of light emission output was achieved and relative output was 99.8%.

EXAMPLE 6

In Example 6, the test was conducted where substantially all of the conditions are the same as those in Example 1. However, in Example 6, so-called planar substrate 110 which is flat and has a non-processed surface (see FIG. 2B) was used instead of the PSS substrate 11 which is used in Example 1. In the nitride semiconductor template 10 of Example 6, a good result was obtained such that the XRD half-value width was 256.1 seconds even though surface resistivity was 20 Ω/sq which shows slight deterioration. Meanwhile, the results of the characteristics of the blue LED element 30 were substantially the same as Example 1 except that the light emission output decreased to 15 mW which is about half of that in Example 1. Especially, relative output which is an index of reliability was 99.7%. The decrease in light emission output is a logical result. The reason therefor is that light extraction efficiency of the PSS substrate 11 is high. Therefore, the decrease in light emission output in Example 6 is not caused by the present invention. This will be clarified in below-described Comparative Examples.

EXAMPLE 7

In Example 7, the test was conducted under substantially the same conditions as those in Example 2. The difference from Example 2 is that the planar substrate 110 is used as described in Example 6. In the nitride semiconductor template 10 of Example 7, the XRD half-value width was 213.4 seconds and surface resistivity was 19 D/sq. The obtained evaluation results were better than those in Example 6. Meanwhile, the results of the characteristics of the blue LED element 30 were substantially the same as Example 2 except light emission output which was 19 mW. Especially, relative output which is an index of reliability was 99.5%. The light emission output was improved as compared to Example 1 and was thus a good result.

EXAMPLE 8

In Example 8, the test was conducted under the same growth conditions as those in Example 1. However, in Example 8, the AlN buffer layer 12 grown by the MOVPE method was taken out once and the subsequent growth of the O-doped GaN layer 13 and the Si-doped GaN layer 14 was carried out by the HVPE method to make the nitride semiconductor template 10. Apart from this, all conditions are the same as those in Example 1. Here, the film thickness of the AlN buffer layer 12 grown by the MOVPE method was 20 nm. In the nitride semiconductor template 10 in Example 8 manufactured under the above-mentioned conditions, the good results equivalent to those in Example 1 were obtained, which are the XRD half-value width of 70.9 seconds and surface resistivity of 18/sq. In addition, substantially in the same manner as Example 1, the good results were obtained for the characteristics of the blue LED element 30, such that light emission output was 31 mW and relative output was 99.7%. Accordingly, it was confirmed that the effects of the invention are obtained even when the AlN buffer layer 12 is grown by the MOVPE method.

COMPARATIVE EXAMPLE 1

Figure 11:
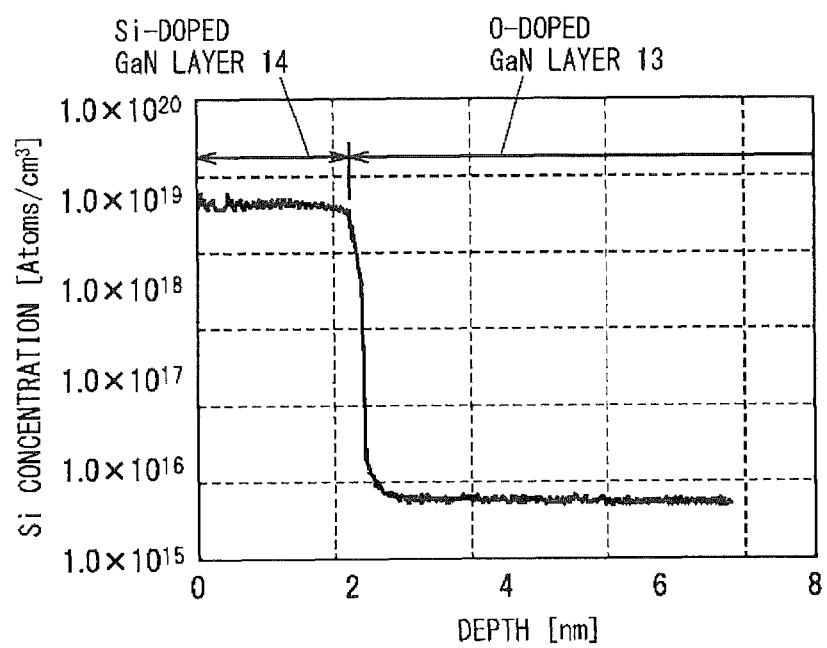
FIG. 11 is a diagram illustrating a profile of Si (silicon) in a GaN layer of Comparative Example 1 by SIMS.
Figure 12:
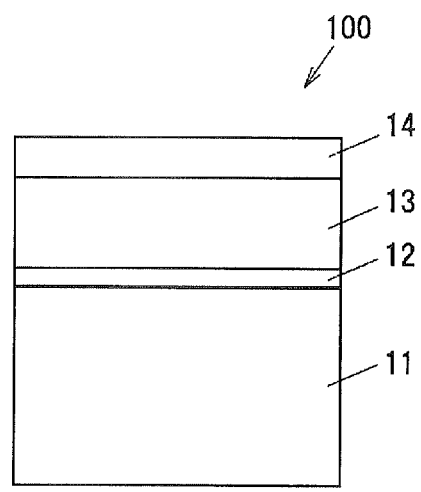
FIG. 12 is a cross sectional view showing a nitride semiconductor template in Comparative Example 1.

FIG. 11 shows a profile of a Si concentration in a nitride semiconductor template 100 of Comparative Example 1 by SIMS. FIG. 12 is a cross sectional view showing the nitride semiconductor template in Comparative Example 1. The basic structure of the nitride semiconductor template 100 in Comparative Example 1 is the same as the structure of Example 1 shown in FIG. 1. Accordingly, only the difference from Example 1 will be described below.

The difference from Example 1 is that the Si concentration gradient layer 14b is not provided and the portion which was for the Si concentration gradient layer 14b in Example 1 is also a high Si concentration layer.

The XRD half-value width of the nitride semiconductor template 100 manufactured as described above was 121.4 seconds. Meanwhile, as a result of evaluating surface resistivity of the nitride semiconductor template 100 by using the non-contact resistivity measurement system, the surface resistivity was 7 Ω/sq. The XRD half-value width was wide due to deterioration of crystalline characteristics caused by the high Si concentration and defects were thereby generated, and the surface resistivity decreased due to the large amount of Si addition according to the above results, i.e., due to the high carrier concentration.

Epitaxial growth for the light-emitting element was carried out on the nitride semiconductor template 100 by the MOVPE method. This growth by the MOVPE method was also carried out under the same conditions as those in Example 1. In detail, multiple films can be simultaneously grown by the MOVPE method and are thus simultaneously grown in Examples of the invention and Comparative Examples. In other words, the epitaxial growth for the light-emitting element is simultaneous growth in all of Examples and Comparative Examples. Therefore, variation is not present in the epitaxial growth for the light-emitting element.

When light-emitting characteristics of the blue LED element in Comparative Example 1 were evaluated at a current of 20 mA, emission peak wavelength was about 453 nm, forward voltage was 3.22V and light emission output was 20 mW. It is presumed that the large amount of Si addition causes deterioration of crystalline characteristics, which results in the wide XRD half-value width and the low light emission output. In addition, the reason for the decrease in light emission output is also that thermal history causes Si diffusion into the light-emitting portion during film formation of the light-emitting diode epitaxial wafer by the MOVPE method and defects are thus formed since the Si concentration gradient layer 14b is not provided. Considering that the relative output as an index of reliability is decreased to 85.2%, it is obvious that the diffused amount of Si is large.

COMPARATIVE EXAMPLE 2

In Comparative Example 1, it was revealed that high Si concentration in the Si-doped GaN layer 14 decreases reliability. Accordingly, in Comparative Example 2, it was attempted to improve reliability by reducing the overall Si concentration, i.e., carrier concentration of the Si-doped GaN layer 14. In detail, in the nitride semiconductor template having the same structure as Comparative Example 1, the Si impurity concentration of the Si-doped GaN layer 14 was maintained constant and the average carrier concentration was maintained constant at $1 \times 10^{17}$ cm$^{-3}$. The XRD half-value width of the nitride semiconductor template manufactured under the above-mentioned conditions was 118.1 seconds and the measured surface resistivity was a high value of 45 Ω/sq.

The reason why the surface resistivity did not decrease is considered that the concentration was uniformly low such as $1 \times 10^{17}$ cm$^{-3}$ without providing the Si concentration gradient layer 14b in the upper portion of the Si-doped GaN layer 14.

Meanwhile, the characteristics of the blue LED element manufactured using the above-mentioned nitride semiconductor template were such that forward voltage was not less than 4V and light emission output was 17 mW. As for reliability of the blue LED element at the time of conducting electric current, relative output was 21.4% also due to the influence of heat caused by the increased forward voltage. The average carrier concentration was, of course, evaluated by the Van der Pauw method and it was confirmed that the average carrier concentration was as planned.

COMPARATIVE EXAMPLE 3

Comparative Example 3 is for the purpose of comparison with Examples 6 and 7.

Figure 13:
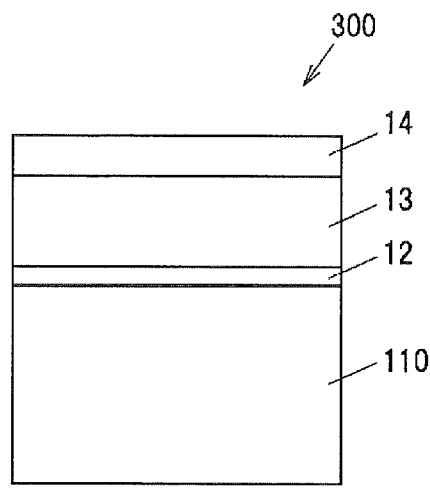
FIG. 13 is a cross sectional view showing a nitride semiconductor template in Comparative Example 3.

That is, the planar substrate 110 is used as a substrate as shown in FIG. 13. In Comparative Example 3, substantially the entire structure is the same as Example 6, and the conditions, the method of making the element and the characteristics evaluation method are also the same. Only the difference from Example 6 will be described below.

The difference from Example 6 is that the Si concentration gradient layer 14b is not provided and the portion which was for the Si concentration gradient layer 14b in Example 6 is also a high Si concentration layer.

The XRD half-value width of a nitride semiconductor template 300 manufactured as described above was 306.9 seconds. Meanwhile, as a result of evaluating surface resistivity of the nitride semiconductor template 300 by using the non-contact resistivity measurement system, the surface resistivity was 9/sq. The XRD half-value width was wide due to defects generated by the high Si concentration. The surface resistivity decreased due to the above-mentioned results and the large amount of Si addition, i.e., the high carrier concentration.

When light-emitting characteristics of the blue LED element in Comparative Example 3 were evaluated at a current of 20 mA, emission peak wavelength was about 456 nm, forward voltage was 3.12V and light emission output was 10 mW. It is presumed that the large amount of Si addition causes deterioration of crystalline characteristics, which results in the wide XRD half-value width and the low light emission output. In addition, the reason for the decrease in light emission output is also that thermal history causes Si diffusion into the light-emitting portion during film formation of the light-emitting diode epitaxial wafer by the MOVPE method and defects are thus formed since the Si concentration gradient layer 14b is not provided. Considering that the relative output as an index of reliability is decreased to 78.4%, it is obvious that the diffused amount of Si is large.

Use of the planar substrate 110 causes a decrease in light emission output in both of Examples 6 and 7 as compared to the case of using the PSS substrate 11, and in addition, the light emission output in Comparative Example 3 having the same structure in which the planar substrate 110 is used is lower than Examples 6 and 7. Therefore, it is natural that the light emission outputs in Examples 6 and 7 are lower than those in other Examples in which the PSS substrate 11 is used. Form the results of Comparative Example 3, it is understood that the reason why the light emission outputs in Examples 6 and 7 are greatly lower than those in other Examples is the influence of a difference in light extraction efficiency between substrates.

Table 1 shows the summary of Examples and Comparative Examples.

TABLE 1

| | Substrate | Surface resistivity (Ω/sq.) | XRD half-value width (second) | Remarks |
|---|---|---|---|---|
| Example 1 | PSS substrate | 17 | 71.6 | t 13 = 6 μm, Ds = $1 \times 10^{17}$ cm$^{-3}$ |
| Example 2 | PSS substrate | 11 | 50.1 | t 13 = 8 μm |
| Example 3 | PSS substrate | 15 | 74.5 | Ds = $5 \times 10^{17}$ cm$^{-3}$ |
| Example 4 | PSS substrate | 28 | 86.9 | t 13 = 4 μm |
| Example 5 | PSS substrate | 17 | 71.6 | Pitch and height of convex portion are changed. |
| Example 6 | planar substrate | 20 | 256.1 | Same as Example 1 except substrate |
| Example 7 | planar substrate | 19 | 213.4 | t 13 = 8 μm |
| Example 8 | PSS substrate | 18 | 70.9 | AlN buffer layer is made by MOVPE method. |
| Comparative Example 1 | PSS substrate | 7 | 121.4 | Without Si concentration gradient layer, Ds = $6 \times 10^{18}$ cm$^{-3}$ |
| Comparative Example 2 | PSS substrate | 45 | 118.1 | Without Si concentration gradient layer, Ds = $1 \times 10^{17}$ cm$^{-3}$ |
| Comparative Example 3 | planar substrate | 9 | 306.9 | Without Si concentration gradient layer, Ds = $7 \times 10^{18}$ cm$^{-3}$ | t 13: Thickness of O-doped GaN layer, Ds: Carrier concentration on the outermost surface Modification 1

Figure 10:
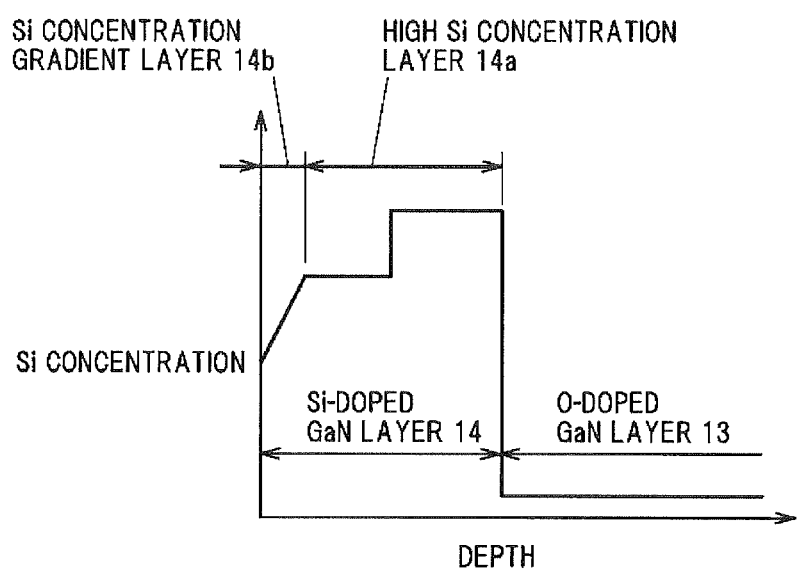
FIG. 10 is a schematic view showing a Si concentration in Modification 1.

Even when the Si impurity concentration of the high Si concentration layer 14a is increased on the O-doped GaN layer 13 side and is decreased on the Si concentration gradient layer 14b side in a stepwise manner so that the average carrier concentration of the Si-doped GaN layer 14 is maintained constant as shown in FIG. 10, the same effects as the embodiments and Examples are obtained as long as the Si concentration gradient layer 14b is provided.

Modification 2

Since the invention is related to a GaN-based film provided on a substrate, it is easy to assume that the effects intended by the invention will be obtained even if the buffer layer is not formed of AlN.

It should be noted that the invention is not intended to be limited to the embodiments and Examples, and the various kinds of modifications can be implemented without changing the gist of the invention. In addition, some constituent elements in each embodiment and each Example can be omitted or arbitrarily combined without changing the gist of the invention, and steps in the flow of each embodiment and each Example can be added, deleted, modified or replaced.

What is claimed is:

1. A nitride semiconductor template, comprising:
a substrate; and
a group III nitride semiconductor layer formed on the substrate and comprising a Si-doped layer doped with Si as an uppermost layer thereof,
wherein the group III nitride semiconductor layer has a total thickness of not less than 4 μm and not more than 10 μm, and
wherein the Si-doped layer comprises a Si concentration gradient layer having a carrier concentration that gradually decreases toward an outermost surface thereof so as to be not less than $1 \times 10^{17}$ cm$^{-3}$ and not more than $5 \times 10^{17}$ cm$^{-3}$ at the outermost surface of the group III nitride semiconductor layer.

2. The nitride semiconductor template according to claim 1, wherein the group III nitride semiconductor layer comprises an O-doped layer doped with O (oxygen) between the substrate and the Si-doped layer.

3. The nitride semiconductor template according to claim 2, wherein the O-doped layer has an O-impurity concentration of not less than $1 \times 10^{16}$ cm$^{-3}$ and not more than $3 \times 10^{19}$ cm$^{-3}$ and an average carrier concentration in a thickness direction of not less than $8 \times 10^{17}$ cm$^{-3}$ and not more than $1 \times 10^{18}$ cm$^{-3}$.

4. The nitride semiconductor template according to claim 1, wherein the Si-doped layer comprises a high Si concentration layer having a uniform carrier concentration in a thickness direction, and
wherein the Si concentration gradient layer has a carrier concentration that gradually decreases from the high Si concentration layer toward the outermost surface.

5. The nitride semiconductor template according to claim 4, wherein the carrier concentration of the high Si concentration layer is not less than $1 \times 10^{17}$ cm$^{-3}$ and not more than $1 \times 10^{19}$ cm$^{-3}$.

6. The nitride semiconductor template according to claim 1, wherein the substrate comprises a PSS (Patterned Sapphire Substrate) comprising a plurality of convex portions on a surface thereof.

7. The nitride semiconductor template according to claim 1, wherein the template has a surface resistivity of not less than 10 Ω/sq and not more than 30 Ω/sq.

8. The nitride semiconductor template according to claim 1, wherein the template has a half-value width at a (0004) plane of not more than 100 seconds by X-ray diffraction measurement.

9. A light-emitting diode, comprising:
a sapphire substrate;
an AlN buffer layer formed on the sapphire substrate;
an n-type group III nitride semiconductor layer formed on the AlN buffer layer;
a multiple quantum well layer formed on the n-type group III nitride semiconductor layer;
a p-type nitride semiconductor layer formed on the multiple quantum well layer;
an exposed portion of the n-type group III nitride semiconductor layer formed by etching from the p-type nitride semiconductor layer to the n-type group III nitride semiconductor layer;
an n-type electrode formed on the exposed portion of the n-type group III nitride semiconductor layer; and
a p-type electrode formed on the p-type nitride semiconductor layer,
wherein the n-type group III nitride semiconductor layer comprises a group III nitride semiconductor layer comprising a Si-doped layer doped with Si as an uppermost layer thereof,
wherein the group III nitride semiconductor layer has a total thickness of not less than 4 μm and not more than 10 μm, and
wherein the Si-doped layer comprises a Si concentration gradient layer having a carrier concentration that gradually decreases toward an outermost surface thereof so as to be not less than $1 \times 10^{17}$ cm$^{-3}$ and not more than $5 \times 10^{17}$ cm$^{-3}$ at the outermost surface of the group III nitride semiconductor layer.

* * * * *